(12) United States Patent
Oesterle et al.

(10) Patent No.: US 8,583,059 B2
(45) Date of Patent: Nov. 12, 2013

(54) METHOD AND CIRCUIT FOR OPERATING A POWER SEMICONDUCTOR COMPONENT

(75) Inventors: Robert Oesterle, Berlin (DE); Christian Keller, Berlin (DE)

(73) Assignee: GE Energy Power Conversion Technology Limited (GB)

( * ) Notice: Subject to any disclaimer, the term of this patent is extended or adjusted under 35 U.S.C. 154(b) by 244 days.

(21) Appl. No.: 13/064,836

(22) Filed: Apr. 20, 2011

(65) Prior Publication Data

US 2011/0309882 A1 Dec. 22, 2011

(30) Foreign Application Priority Data

Jun. 16, 2010 (DE) .......................... 10 2010 024 038

(51) Int. Cl.
*H04B 1/16* (2006.01)

(52) U.S. Cl.
USPC ......................................... 455/91; 455/127.1

(58) Field of Classification Search
USPC ............ 455/73, 91, 92, 102, 103, 115.1, 118, 455/126, 127.1–127.4; 330/129, 51
See application file for complete search history.

(56) References Cited

U.S. PATENT DOCUMENTS

| | | | |
|---|---|---|---|
| 6,337,799 B1 | 1/2002 | Belwon | |
| 7,113,744 B1 * | 9/2006 | Moloudi et al. | 455/118 |
| 2006/0160503 A1 * | 7/2006 | Ichitsubo et al. | 455/127.1 |
| 2008/0265935 A1 | 10/2008 | Bakker et al. | |

FOREIGN PATENT DOCUMENTS

| | | | |
|---|---|---|---|
| DE | 10223496 A1 | 1/2003 | |
| EP | 0620645 A2 | 10/1994 | |

OTHER PUBLICATIONS

German Office Action for German Patent Application No. DE 10 2010 024 038.9 dated Jan. 7, 2011.

* cited by examiner

*Primary Examiner* — Thanh Le
(74) *Attorney, Agent, or Firm* — GE Global Patent Operation; Catherine J. Toppin

(57) ABSTRACT

Described is a method for operating a power semiconductor component. A power amplifier provided with a programmable logic is assigned to this power semiconductor component. In at least one embodiment, control signals for the power semiconductor component are transmitted to the power amplifier. The power semiconductor component is influenced by the power amplifier in dependence on these control signals. The type and manner in which the power semiconductor component is influenced is determined by the programming of the logic. The power amplifier can be sent programming signals which are then processed by a processor of the power amplifier. The programming of the logic is changed by the processor in dependence on the programming signals.

21 Claims, 1 Drawing Sheet

METHOD AND CIRCUIT FOR OPERATING A POWER SEMICONDUCTOR COMPONENT

PRIORITY STATEMENT

The present application hereby claims priority under 35 U.S.C. §119 on German patent application number DE 10 2010 024 038.9 filed Jun. 16, 2010, the entire contents of which are hereby incorporated herein by reference.

FIELD

At least one embodiment of the invention generally relates to a method as well as a circuit for operating an electrical power semiconductor component.

BACKGROUND

As is known, a power semiconductor component can be controlled with the aid of a power amplifier, wherein it is also known that the power amplifier comprises a programmable logic for specifying the type and manner of controlling the semiconductor component with a corresponding programming. During the course of using the power amplifier it may therefore be necessary to change the programming of the logic. This can be realized, for example, by a service technician who manually connects the logic to a programming tool, e.g. a notebook computer, to transfer a program update from the notebook computer to the programmable logic, thereby re-programming the logic. This operation must take place at the location of the semiconductor component and/or the power amplifier. With an electric converter connection, which comprises a plurality of semiconductor components and associated power amplifiers, the expenditure for the above-explained operation is obviously extremely high.

SUMMARY

In at least one embodiment of the present invention, a method and/or a circuit for driving a power semiconductor component is disclosed, which can be used to transmit a program update with less expenditure to the programmable logic.

At least one embodiment is directed to a method, and at least one embodiment is directed to a circuit.

In at least one embodiment, a power amplifier with a programmable logic is assigned to the semiconductor component. Signals for controlling the semiconductor component are transmitted to the power amplifier, and the semiconductor component is influenced by the power amplifier in dependence on the control signals. The type and manner in which the semiconductor component is influenced is determined in this case by the programming of the logic. Programming signals are transmitted to the power amplifier and are processed by a processor in the power amplifier. The programming of the logic is changed by the processor in dependence on the programming signals.

In at least one embodiment according to the invention, a program update can be transmitted to the programmable logic of the power amplifier by transmitting the corresponding programming signals to the power amplifier, so that the processor therein can install a new program or can re-program the logic on the basis of these programming signals. As a result, it is no longer necessary for the service technician to intervene directly at the location of the semiconductor component or the power amplifier. Instead, it is sufficient that the programming signals are in some way transmitted to the power amplifier where the programming signals are automatically processed further for the new programming or re-programming of the logic.

According to one advantageous modification of at least one embodiment of the invention, the logic is switched by the processor to a programming operation in which the semiconductor component is no longer influenced in dependence on the control or control signals. As a result, malfunctions of the power amplifier which may occur during the programming of the logic are avoided.

For a different advantageous embodiment of the invention, the programming signals are transmitted by a control unit. A central control unit can thus be used for a new programming as disclosed by the invention of several power amplifiers belonging to different power semiconductor components, wherein this also means that the service technician no longer needs to install a separate program update on each power amplifier. Instead, the new programming can be transmitted automatically from the central control unit to all power amplifiers, thus resulting in another essential simplification.

The advantages of at least one embodiment of the invention are particularly important for a converter connection having a plurality of semiconductor components with associated power amplifiers. According to at least one embodiment of the invention, it is only necessary in that case to notify the control unit which programming signals must be transmitted to the plurality of power amplifiers, so that the control unit can automatically transmit these programming signals to all power amplifiers without requiring additional manual operations.

It is especially advantageous if the control unit for the converter connection is suitable for a remote operation. In that case, it is no longer necessary for the service technician to go to the location of the converter connection.

Instead, the programming signals can be transmitted via remote to the control unit and can subsequently be installed by the control unit in the power amplifiers.

BRIEF DESCRIPTION OF THE DRAWINGS

Additional features, options for use and advantages of the invention can be deduced from the following description of example embodiments of the invention which are shown in the Figures. All described or illustrated features by themselves or in any optional combination in this case represent the subject matter of the invention, regardless of how they are combined in the patent claims or of the references back and regardless of how they are formulated and/ore described in the description or illustrated in the drawings.

DETAILED DESCRIPTION OF THE EXAMPLE EMBODIMENTS

Figure 1:
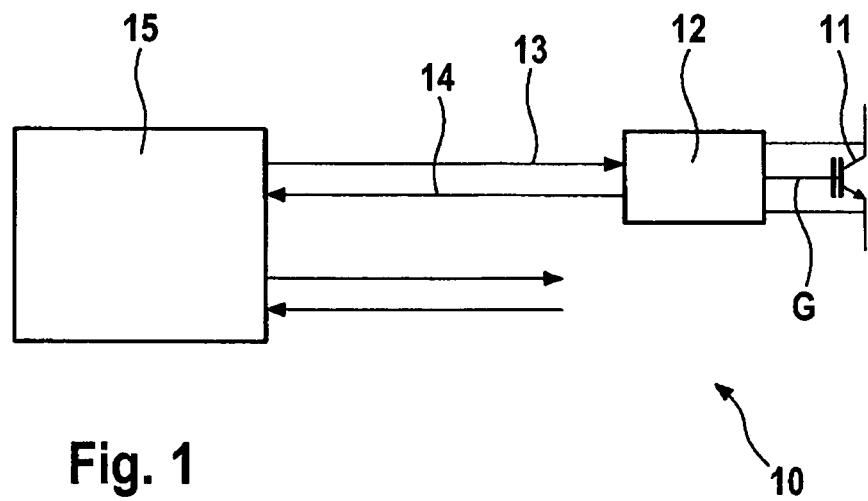
FIG. 1 shows a schematic block diagram of a circuit according to an embodiment of the invention for operating a power semiconductor component.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 shows a circuit 10 for which a power semiconductor component 11 is controlled by a power amplifier 12. The power semiconductor component 11 can be an IGBT (IGBT=insulated gate bipolar transistor) or a GTO thyristor (GTO=gate turn off) or the like. For the exemplary embodiment shown in FIG. 1, the gate G of the power semiconductor component 11 is admitted by the power amplifier, wherein the collector and the emitter are furthermore also connected to the power amplifier 12. It is understood that this controlling action can also be configured differently.

The power amplifier 12, in turn, is connected via two optical waveguides 13, 14 to a control unit 15. The two optical waveguides 13, 14 are intended to transmit signals in opposite directions. It is understood that other types of potential-isolating transmission media or other transmission modes can conceivably also be used in place of the optical waveguides 13, 14, for example optical couplers or magnetic transmission devices or wireless transmission or the like. If applicable, the electric signals in both transmission directions can also be transmitted and received via a single transmission medium.

As indicated in FIG. 1, the control unit 15 can furthermore be connected via additional optical waveguides to additional power amplifiers and thus also to additional power semiconductor components. However, only a single power semiconductor component is used in the following to explain the mode of operation for the circuit 10, shown in FIG. 1. It is understood that this mode of operation can also apply to a plurality of power semiconductor components with the associated power amplifiers.

Figure 2:
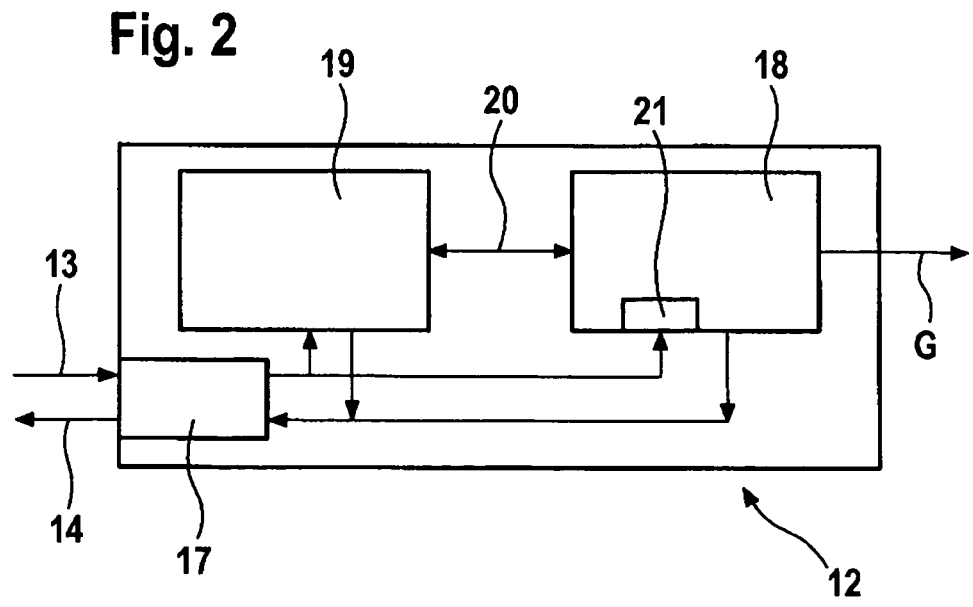
FIG. 2 shows a schematic block diagram of a power amplifier according to an embodiment of the invention for the circuit as shown in FIG. 1.

The power amplifier 12 is shown in further detail in FIG. 2. The power amplifier 12 comprises a transceiver 17 to which the two optical waveguides 13, 14 are connected. This transceiver can receive light signals arriving via the optical waveguide 13 and can transmit light signals via the optical waveguide 14.

The transceiver 17 is connected to a programmable logic 18 and a processor 19. In FIG. 2, these connections are illustrated with the example of simple back and forth lines. It is understood that other connection options are conceivable as well, for example parallel or serial bus structures or the like.

The logic 18 is provided with an output for controlling the gate G of the power semiconductor component 11. The logic 18 and the processor 19 are furthermore connected via a bi-directional line 20, wherein it is understood that the line 20 can be any type of connecting line, in particular a parallel or serial bus structure.

The logic 18, for example, can be an integrated circuit into which a logic circuit can be programmed, meaning in particular a so-called FPGA (FPGA=field programmable gate array). Alternatively, it can also be a so-called CPLD (CPLD=complex programmable logic device) or a similar integrated circuit. In any case, the logic 18 can be programmed with the aid of programming signals. The programming signals can function to specify a particular mode of operation for the logic 18. This mode of operation for the logic 18 defines the type and manner in which the gate G of the power semiconductor component 11 is controlled by the power amplifier 12. For example, the programming determines the chronological sequence for switching the power semiconductor component 11 on or off.

The processor 19 can be a standard microprocessor or a signal processor or the like.

During the normal operation of the circuit 10, control signals are transmitted by the control unit 15 via the optical waveguide 14 to the power amplifier 12. These signals are also referred to as "firing pulses FP." The control signals or firing pulses are received by the transceiver 17 of the power amplifier 12 and are processed by the logic 18. Depending on the individual control signals, the logic 18 then turns the power semiconductor component 11 on or off via its gate G, either conducting or blocking.

The control signals generally are defined signals with a predetermined pulse duration and amplitude. Based thereon, the logic 18 can detect the control signals and can differentiate these from other signals, wherein a filter 21 can be arranged upstream of the logic 18 which only transmits the control signals for the further processing. For example, it is possible that the pulse duration of the control signals is longer and that the filter 21 does not permit other signals with shorter signal duration to pass.

In a manner not shown herein, the power amplifier 12 can detect the switching operations of the power semiconductor component 11 via the connection to the collector and the emitter of the power semiconductor component 11. In dependence thereof, the transceiver 17 in the power amplifier 12 can transmit a so-called "indication pulse IP" via the optical waveguide 13 to the control unit 15. The control unit 15 can then deduce whether the power semiconductor component 11 is functional or whether a malfunction exists on the basis of this "indication pulse IP."

During the normal operation of the circuit 10, the control signals are also received by the processor 19, but are not processed further.

During a programming operation of the circuit 10, the programming signals are transmitted by the circuit 10 via the optical waveguide 13 to the power amplifier 12. The programming signals are received by the transceiver 17 and are then transmitted to the logic 18 and the processor 19.

The programming signals in particular differ with respect to the signal length and the signal amplitude from the control signals. For example, the programming signals can have shorter signal duration. The programming signals are therefore filtered out by the filter 21 and are not transmitted further to the logic 18. The programming signals consequently are not processed by the logic 18 for the purpose of controlling the power semiconductor component 11. However, the programming signals are processed by the processor 19.

It is possible that the processor 19 can identify and further process as such the programming signals transmitted by the control unit. Alternatively, it is possible that the transmitted programming signals are provided with a start coding at the start of the transmission which informs the processor 19 that the actual programming signals will follow.

Once the processor 19 has detected the reception of the programming signals, the logic 18 is switched by the processor 19 via the line 20 from the normal operation to the programming operation. It means that the power semiconductor component 11 is no longer controlled by the logic 18 and that the logic 18 furthermore also does not carry out other functions relating to the power semiconductor component 11.

The received programming signals are then processed by the processor 19 to the effect that the logic 18 can now be programmed with these programming signals.

For example, it is possible that the programming signals are processed by the processor 19 in such a way that they subsequently correspond to the so-called JTAG protocol (JTAG=joint test action group), wherein that is a standardized protocol for programming integrated circuits. In particular, the previously mentioned FPGAs or CPLDs can be programmed with the aid of the JTAG protocol.

The processed programming signals are transmitted by the processor 19 via the line 20 to the logic 18. If applicable, the programming signals received by the logic 18 are acknowledged via the same line 20 to the processor 19. In this way, a new mode of operation is specified for the logic 18 in dependence on the programming signals. The logic 18 is thus programmed via the line 20 on the basis of the processed programming signals.

The end of the programming operation can be communicated, either by ending the transmission of the programming signals or by sending a coding indicating the end of the transmission, which is transmitted last by the control unit 15 to the processor 19. Once the programming of the logic 18 is finished, the processor 19 switches the logic 18 via the line 20 back to normal operation. In addition, the end of the programming operation and/or the switching back to the normal operation can be communicated by the processor 19 via the transceiver 17 to the control unit 15. However, for the further operation of the circuit 10, it may be necessary for the control unit 15 to additionally transmit a reset signal or the like.

Insofar as required, the logic 18 of the power amplifier 12 can be programmed anew with the method explained in the above. In particular, a so-called program update of the logic 18 can be carried out in this way, wherein it is understood that additional power amplifiers of power semiconductor components can also be programmed in the same way. For example, it is possible in this way to program all power amplifiers of the power semiconductor components of a converter connection.

If the control unit 15 is intended to influence all power amplifiers of the power semiconductor components of a complete converter connection, then all power amplifiers can also be programmed by this control unit 15. If the control unit 15 is additionally equipped to operate jointly with a so-called remote maintenance control, it is possible to program the power amplifiers of the converter connection via this remote control.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for operating a power semiconductor component, the method comprising:
    assigning a power amplifier to the power semiconductor component, the power amplifier including a programmable logic;
    transmitting control signals to the power amplifier, the control signals being configured to activate the power semiconductor component;
    influencing, by the power amplifier, the power semiconductor component based on the control signals, a type and manner of the influencing being determined by the programming of the programmable logic; and
    changing, by a processor of the power amplifier, the programming of the programmable logic based on programming signals sent to the power amplifier.

2. The method according to claim 1, further comprising switching the programmable logic into a programming operation in which the power semiconductor component is no longer influenced by the control signals.

3. The method according to claim 2, wherein the changing the programming of the programmable logic occurs during the programming operation.

4. The method according to claim 2, wherein at least one of a start coding and an end coding are transmitted within the programming signals, the start coding indicating a start of the programming operation and the end coding indicating an end of the programming operation.

5. The method according to claim 1, wherein the programming signals are sent by a control unit.

6. The method according to claim 1, wherein the programming signals are sent by one of a potential isolating medium and a potential isolating process to the power amplifier.

7. The method according to claim 6, wherein the programming signals are sent by one of a potential isolating medium and a potential isolating process to the power amplifier via optical waveguides.

8. The method according to claim 1, wherein the programming signals are not processed by the programmable logic for the control of the power semiconductor component.

9. The method according to claim 1, wherein the programming signals correspond to joint test action group (JTAG) protocol.

10. The method according to claim 9, further comprising switching the programmable logic into a programming operation in which the power semiconductor component is no longer influenced by the control signals.

11. The method according to claim 10, wherein the changing of the programming of the programmable logic occurs during the programming operation.

12. A non-transitory computer readable medium including program segments for, when executed on a computer device, causing the computer device to implement the method of claim 1.

13. An electric circuit for operating a power semiconductor component, comprising:
    a power amplifier, including
        a programmable logic assigned to the power semiconductor component, the programmable logic being configured to influence the power semiconductor component based on control signals receivable by the power amplifier, a type and manner of the influencing being based on a programming of the programmable logic, and
        a processor configured to change the programming of the programmable logic based on programming signals, the programming signals being receivable by the power amplifier.

14. The circuit according to claim 13, wherein the programming of the programmable logic is changeable by the processed programming signals.

15. The circuit according to claim 14, wherein the programmable logic is one of a field programmable gate array (FPGA) and a complex programmable logic device (CPLD).

16. The circuit according to claim 13, wherein the programmable logic is a field programmable gate array (FPGS) or a complex programmable logic device (CPLD).

17. The circuit according to claim 13, wherein the power amplifier further includes a filter configured to filter the programming signals, the filter being arranged upstream from the programmable logic.

18. The circuit according to claim 13, further comprising a control unit configured to transmit the programming signals to the power amplifier.

19. The circuit according to claim 13, further comprising optical waveguides configured to transmit the programming signals to the power amplifier.

20. A converter connection comprising:
   the circuit according to claim 13, wherein the semiconductor component is a plurality of power semiconductor components having associated power amplifiers.

21. The converter connection according to claim 20, wherein the circuit includes a control unit configured for remote maintenance control.

* * * * *